United States Patent
Cao et al.

(10) Patent No.: US 10,020,915 B2
(45) Date of Patent: *Jul. 10, 2018

(54) SYSTEM AND METHOD FOR USER EQUIPMENT COOPERATION

(71) Applicant: Futurewei Technologies, Inc., Plano, TX (US)

(72) Inventors: Yu Cao, Ottawa (CA); Amine Maaref, Kanata (CA); Mohammadhadi Baligh, Ottawa (CA); Jianglei Ma, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/860,076

(22) Filed: Sep. 21, 2015

(65) Prior Publication Data
US 2016/0013889 A1      Jan. 14, 2016

Related U.S. Application Data

(63) Continuation of application No. 14/027,919, filed on Sep. 16, 2013, now Pat. No. 9,148,253.

(51) Int. Cl.
*G06F 11/10*    (2006.01)
*H03M 13/29*    (2006.01)
(Continued)

(52) U.S. Cl.
CPC ........ *H04L 1/0061* (2013.01); *G06F 11/1004* (2013.01); *H03M 13/095* (2013.01);
(Continued)

(58) Field of Classification Search
CPC ....... H04L 1/0061; H04L 1/06; H04L 25/067; H04L 27/3416; H04L 1/1819;
(Continued)

(56) References Cited

U.S. PATENT DOCUMENTS

| | | | |
|---|---|---|---|
| 5,450,453 | A | 9/1995 | Frank |
| 7,376,209 | B2 | 5/2008 | Namgoong et al. |

(Continued)

FOREIGN PATENT DOCUMENTS

| | | |
|---|---|---|
| CN | 101345601 A | 1/2009 |
| CN | 101854226 A | 10/2010 |

(Continued)

OTHER PUBLICATIONS

Kwon, T., et al., "LLR-Based Symbol Selective Transmission With a Near-Optimal Threshold to Minimize BEP for Demodulation-Forward Relay Systems," IEEE Transactions on Wireless Communications, Feb. 2010, 6 pages, vol. 9, No. 2.

(Continued)

*Primary Examiner* — James C Kerveros
(74) *Attorney, Agent, or Firm* — Slater Matsil, LLP

(57) ABSTRACT

An embodiment method includes receiving, by a first user equipment (UE), a message, for a second UE, transmitted over a plurality of resource blocks (RBs) on behalf of a communications controller and determining a plurality of log-likelihood ratios (LLRs) in accordance with the received plurality of RBs. The method also includes transmitting, a subset of the determined LLRs to the second UE.

18 Claims, 6 Drawing Sheets

(51) Int. Cl.
  *H04L 25/06* (2006.01)
  *H04L 1/18* (2006.01)
  *H04L 27/34* (2006.01)
  *H04L 1/06* (2006.01)
  *H03M 13/37* (2006.01)
  *H03M 13/00* (2006.01)
  *H03M 13/09* (2006.01)
  *H04L 1/00* (2006.01)

(52) U.S. Cl.
  CPC ... *H03M 13/2957* (2013.01); *H03M 13/3723* (2013.01); *H03M 13/612* (2013.01); *H04L 1/06* (2013.01); *H04L 1/1819* (2013.01); *H04L 25/067* (2013.01); *H04L 27/3416* (2013.01); *H04L 2001/0097* (2013.01)

(58) Field of Classification Search
  CPC ........ H04L 2001/0097; H03M 13/612; H03M 13/2957; H03M 13/3723; H03M 13/095; G06F 11/1004
  USPC .......................................................... 714/807
  See application file for complete search history.

(56) References Cited

U.S. PATENT DOCUMENTS

| | | | |
|---|---|---|---|
| 8,132,085 | B2 | 3/2012 | Gurevitz et al. |
| 8,234,556 | B2 | 7/2012 | Gamage et al. |
| 8,270,543 | B1 * | 9/2012 | Fattal ................... H04L 25/067 375/262 |
| 8,793,560 | B2 | 7/2014 | Sidi et al. |
| 8,839,079 | B2 | 9/2014 | Chen et al. |
| 2004/0258139 | A1 | 12/2004 | Namgoong et al. |
| 2007/0260959 | A1 | 11/2007 | Sidi et al. |
| 2008/0028277 | A1 | 1/2008 | Cho et al. |
| 2010/0110967 | A1 | 5/2010 | Sartori et al. |
| 2012/0207193 | A1 | 8/2012 | Kim et al. |
| 2012/0219097 | A1 | 8/2012 | McCloud et al. |
| 2013/0051444 | A1 | 2/2013 | Roh |

FOREIGN PATENT DOCUMENTS

| | | |
|---|---|---|
| WO | 2012115678 A1 | 8/2012 |
| WO | 2013130362 A1 | 9/2013 |

OTHER PUBLICATIONS

Sadek, A., et al., "Multinode Cooperative Communications in Wireless Networks," IEEE Transactions on Signal Processing, Jan. 2007, 15 pages, vol. 55, No. 1.

Fujitsu, "Grouped and Encoded Packet based HARQ for LTE-Advanced," 3GPP TSG-RAN1 #55, R1-084295, Prague, Czech Republic, Nov. 10-14, 2008, Powerpoint, 8 pgs.

Fujitsu, "Grouped and Encoded Packet based HARQ for LTE-Advanced," 3GPP TSG-RAN1 #55, R1-084295, Prague, Czech Republic, Nov. 10-14, 2008, 11 pgs.

Haghighat, J., et al., "Decode-Compress-and-Forward with Selective-Cooperation for Relay Networks," IEEE Communications Letters, vol. 16, No. 3, Mar. 2012, pp. 378-381.

PCT International Search Report and Written Opinion, PCT/CN2014/085860, Applicant: Huawei Technologies Co., Ltd., dated Dec. 10, 2014, 12 pages.

Iwase, M., et al., "Optical Transceiver Modules for Gigabit Ethernet PON FTTH System," Furukawa Review, No. 28, Aug. 2005, 7 pgs.

Masuko, et al., "A Low Cost PON Transceiver using Single TO-CAN Type micro-BOSA" Proceedings of 2006 Electronic Components and Technology Conference, pp. 1082-1086.

NEC Group, "Mu-MIMO: Demodulation at the Mobile Station," 3GPP TSG-RAN WG1 Meeting #56, R1-090649, Athens, Greece, Feb. 9-13, 2009, 9 pgs.

QUALCOMM Europe, "Description and Simulations of Hierarchical Modulation Technique for E-UTRA MBMS Evaluation," 3GPP TSG-RAN WG1 #42, R1-050902, London, United Kingdom, Aug. 29-Sep. 2, 2005, 11pgs.

* cited by examiner

SYSTEM AND METHOD FOR USER EQUIPMENT COOPERATION

This application is a continuation of U.S. patent application Ser. No. 14/027,919, filed on Sep. 16, 2013, entitled "System and Method for User Equipment Cooperation," which application is hereby incorporated herein by reference.

TECHNICAL FIELD

The present invention relates to a system and method for wireless communications, and, in particular, to a system and method for user equipment (UE) cooperation.

BACKGROUND

In wireless networks, the rate of data consumption and the density of mobile devices are increasing. With the increase in the density of mobile devices, device-to-device (D2D) communications via local connectivity has emerged. D2D communications are often performed over WiFi or Bluetooth over an unlicensed band. However, D2D may also be performed over a licensed cellular band in a cellular network via central controlled dedicated bands with an improved interference controlled environment.

D2D communications may be used for user equipment (UE) cooperation, which may increase cellular throughput and coverage. In a cellular system, there are significantly more idle UEs than serving UEs at a given time. When UEs are close to each other, UE cooperation may offer the benefits of virtual multiple-input multiple-output (MIMO) receivers.

SUMMARY

Technical advantages are generally achieved, by embodiments of this disclosure which describe systems and methods for user equipment (UE) cooperation.

An embodiment method includes receiving, by a first user equipment (UE), a message, for a second UE, transmitted over a plurality of resource blocks (RBs) on behalf of a communications controller and determining a plurality of log-likelihood ratios (LLRs) in accordance with the received plurality of RBs. The method also includes transmitting, a subset of the determined LLRs to the second UE.

An embodiment method includes receiving, by a central controller from a first UE, a first signal-to-noise ratio (SNR) measurement corresponding to a resource block (RB) and receiving, by the central controller from a second UE, a second SNR measurement corresponding to the RB. The method also includes determining a selected UE to transmit a set of log-likelihood ratios (LLRs) corresponding to the RB in accordance with the first SNR measurement and the second SNR measurement.

An embodiment central controller includes a processor and a non-transitory computer readable storage medium storing programming for execution by the processor. The programming includes instructions to receive, from a first UE, a first signal-to-noise ratio (SNR) measurement corresponding to a first resource block (RB) and receive, by the central controller from a second cooperating UE, a second SNR measurement corresponding to the first RB. The programming also includes instructions to determine a selected UE to transmit a set of log-likelihood ratios (LLRs) corresponding to the first RB in accordance with the first SNR measurement and the second SNR measurement.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

User equipment (UE) cooperation can be improved by relaying partial soft information to target UEs. More specifically, a cooperating UE may relay a subset of log-likelihood ratios (LLRs) to the target UE. The subset of LLRs may correspond to fewer than all resource blocks of the original transmission. This may allow UE cooperation to be effective when the cooperating UE was only able to decode a portion of the original transmission. This may also allow fewer network resources (e.g., bandwidth, etc.) to be used when the target UE does not need all of the soft information to decode the original transmission. Multiple cooperating UEs can provide different subsets of LLRs, and the subsets may or may not overlap with one another. One UE cooperation technique is for cooperating UEs to forward soft information values, such as LLRs, of decoded signals to target UEs. However, this approach typically requires extensive bandwidth, because each cooperating UE transmits one LLR for each encoded bit. Because of the high bandwidth, another method of UE cooperation may be desired.

Aspects of this disclosure provide UE cooperation techniques that exploit the forwarding of selected LLRs by cooperating UEs to a target UE. Notably, LLRs for forwarding may be selected so the most useful LLRs are forwarded and less useful LLRs are not forwarded.

Figure 1:
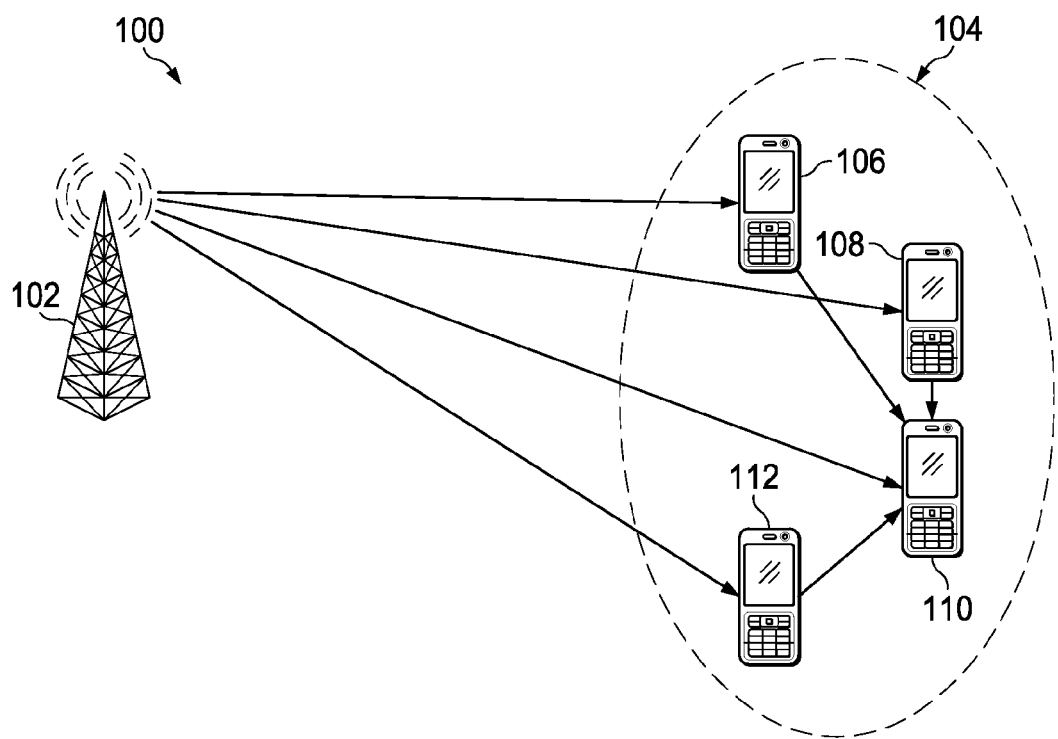
FIG. 1 illustrates an embodiment system for user equipment (UE) cooperation.

FIG. 1 illustrates system 100 for UE cooperation. System 100 comprises communications controller (CC) 102 and a plurality of UEs. Four UEs are depicted, but fewer or more may be present. Communications controller 102 may be any component capable of providing wireless access by, inter alia, establishing uplink and/or downlink connections with the UEs, such as a base station, an enhanced base station (eNB), a picocell, a femtocell, and other wirelessly enabled devices. The UEs may be any component capable of establishing a wireless connection with communications controller 102, such as cell phones, smart phones, tablets, sensors, etc. The UEs include cooperating UEs (CUES) 106, 108, and 112, and target UE (TUE) 110 in neighborhood 104. When a communication starts, communications controller 102 broadcasts data to the UEs. In one example, communications controller 102 is aware of the cooperation amongst the UEs. In another example, communications controller 102 is not aware of the UE cooperation. Cooperating UEs 106, 108, and 112 and target UE 110 listen to the data broadcast by communications controller 102. Then, some or all of cooperating UEs 106, 108, and 112 may forward data to target UE 110 to assist target UE 110. The target UE may discover and select a group of nearby cooperating UEs, such as cooperating UEs 106, 108, and 112.

One example UE cooperation strategy is decode and forward (D&F). In D&F, each cooperating UE attempts to decode the information received from the communications controller destined for the target UE. The successfully decoded information is re-encoded and forwarded to the target UE from the cooperating UEs. The target UE decodes the information received from the communications controller and the relayed information received from the cooperating UEs. If none of the UEs can decode the information, the transmission fails. D&F is well suited for the situation when the links between the communications controller and the cooperating UEs is significantly better than the link from the communications controller to the target UE. However, at least one of the cooperating UEs or the target UE has to be able to decode the information for D&F to be effective.

Thus, D&F has a performance worse than virtual multiple-input multiple-output (VMIMO) even with perfect device-to-device (D2D) links.

Another UE cooperation strategy is amplify and forward (A&F). In A&F, the cooperating UEs amplify the analog noisy signal received from the communications controller to its own transmitter power and forward the amplified noisy signals to the target UE.

In another example of UE cooperation, compress and forward (C&F) is performed. The cooperating UEs compress and quantize the signals received from the communications controller. Then, the cooperating UEs re-encode the quantized bits for forwarding to the target UE. The cooperating UEs also forward their access link quality to the target UE, so the target UE may perform joint reception decoding. The signal transmitted is:

$$x_{c,i} = y_{c,i} + w_j,$$

where $y_{c,i}$ is received signal at the ith cooperating UE, and $w_j$ is the quantization or compression noise. The power distribution of the compression noise depends on the method of the quantization and compression.

If the D2D links are assumed to be ideal, the target UE may perform a joint reception (JR) strategy. In JR, the received signal at the cooperating UE is:

$$y_{c,i} = h_{a,i} x_s + n_{a,i},$$

where $h_{a,i}$ is the instantaneous access link channel gain for the ith cooperating UE, $x_s$ is the transmitted signal from the communication controller, and $n_{a,i}$ is the additive white Gaussian noise (AWGN) at the access link for the ith cooperating UE. The received signal at the target UE is:

$$y_d = h_d x_s + n_d,$$

where $h_d$ is the instantaneous access link channel gain in the channel from the cooperating UE to the target UE and $n_d$ is the AWGN for the channel from the cooperating UE to the target UE. It may be assumed that $h_{a,i}$ and $y_{c,i}$ are known by the target UE.

To decode the received information, the target UE applies a multiple-input multiple-output (MIMO) receiver, such as a MIMO minimum mean squared error (MMSE) receiver. The performance of JR is similar to that of VMIMO, and provides an upper bound to the performance achieved by UE cooperation. In the single antenna case, the receiver is a maximal-ratio combing (MRC) receiver.

C&F is especially useful when the cooperating UEs are located near the target UE. One type of C&F scheme is LLR combining. The LLR, the ratio of two probabilities that indicates the reliability of bits, is given by:

$$LLR = \log \frac{Pr(x=1 \mid y, h)}{Pr(x=0 \mid y, h)},$$

where y is the received signal, h is the channel gain, x is the binary information bit or encoded bit. LLR combining is a soft combining based UE cooperation strategy. Instead of compressing the received signals, the cooperating UEs demodulate and compute the LLRs of the encoded bits. Then, the cooperating UEs quantize the LLRs, and re-encode them for forwarding to the target UE. The target UE recovers the LLRs from the cooperating UEs by decoding the quantized LLR bits, and combines the received LLRs from the cooperating UEs and the communications controller. The combined LLR is the soft input for a turbo decoder, which then decodes the information.

Figure 2:
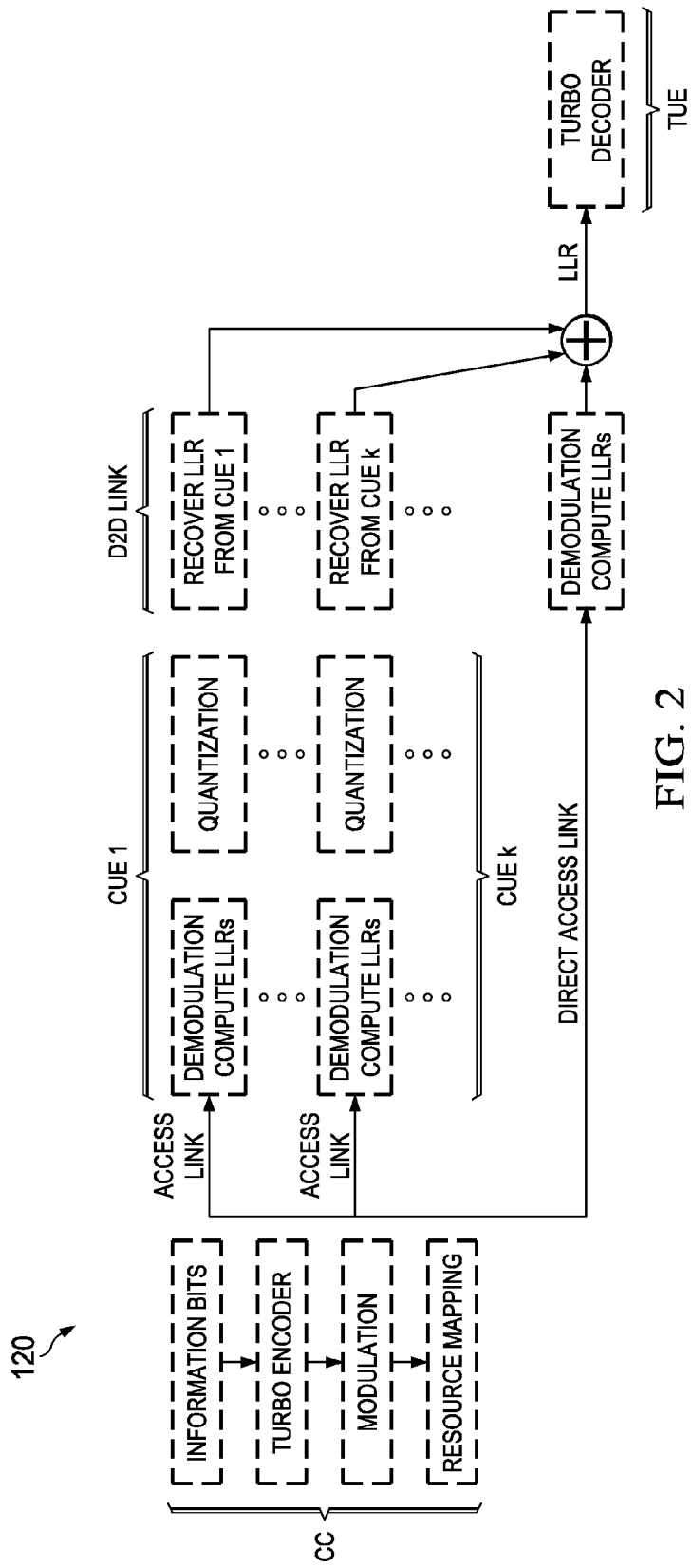
FIG. 2 illustrates a diagram for an embodiment method of log-likelihood ratio (LLR) combining.

FIG. 2 illustrates diagram 120 for LLR combining. The communications controller receives information bits for transmission to a target UE. The received information bits are encoded using a turbo encoder. After encoding, the information is modulated and mapped to resources. The communications controller then broadcasts the information on access links to cooperating UEs and the target UE.

The cooperating UEs receive and demodulate the information. Next, the cooperating UEs quantize the information, and transmit it on D2D links to the target UE.

The target UE receives the information on a direct access link from the communications controller. Then, the target UE demodulates and computes the LLRs for the direct access information. Also, the target UE receives the quantized information from the cooperating UEs and recovers the LLRs from the cooperating UEs. The target UE adds computed and recovered LLRs together. Then, the combined LLRs are used by the turbo decoder to decode the information.

When there are multiple cooperating UEs, the amount of bandwidth and time resources for LLR combining are significant. Frequency selectivity of the access links may be exploited to reduce the bandwidth. The LLRs represent the reliability of the encoded bits. Because of the variation of channel qualities in different bands, the reliabilities of the received encoded bits are different for each UE. Thus, only good or reliable LLRs may be forwarded to the target UE to reduce the burden on the D2D links.

Figure 3:
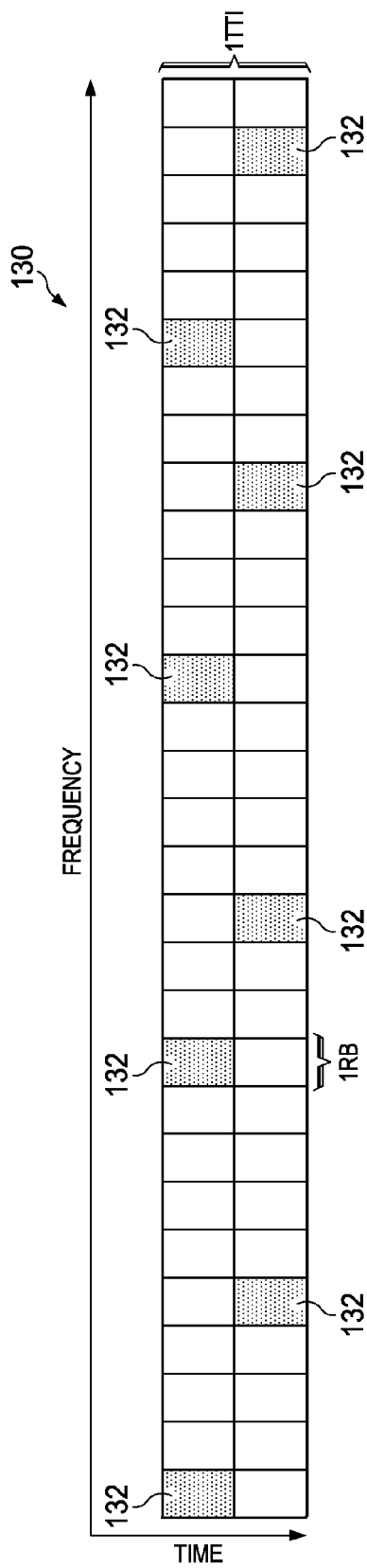
FIG. 3 illustrates a diagram of physical resource mapping.

The variation in reliability of LLRs depends on the fading channels and the RB allocation. FIG. 3 illustrates RB distribution 130 for a long term evolution (LTE) system in time and frequency. One transmission time interval (TTI) is pictured. For each transport block, the physical layer resource can be distributed to achieve the maximum frequency diversity. RBs 132 are selected for frequency diversity. Alternatively, continuous resource block assignment may be used.

For binary phase-shift keying (BPSK), the received signal for a single encoded bit is given by:

$$y = h\sqrt{E_s}b + n,$$

where b=1 when x=0 and b=−1 when x=1, and n is the Gaussian noise, $E_s$ is the symbol energy. The LLR is defined as the log of the ratio of the probabilities of input bits when observing output y as the received signal, or:

$$LLR = \log\frac{Pr(x=1 \mid y, h)}{Pr(x=0 \mid y, h)}.$$

The LLR may be computed as:

$$LLR(x \mid y) = \log\left(\frac{p(y \mid x=1)}{p(y \mid x=0)}\right) + \log\left(\frac{P(x=1)}{P(x=0)}\right).$$

The prior LLR is:

$$LLR(x) = \log\left(\frac{P(x=1)}{P(x=0)}\right).$$

For equal prior probabilities, LLR(x)=0.

Because the noise follows a Gaussian distribution, $$p(y \mid x=1) = \frac{1}{\sqrt{2\pi\sigma_n^2}} e^{-\frac{\|y + h\sqrt{E_s}\|^2}{2\sigma_n^2}}, \text{ and}$$

$$p(y \mid x=0) = \frac{1}{\sqrt{2\pi\sigma_n^2}} e^{-\frac{\|y - h\sqrt{E_s}\|^2}{2\sigma_n^2}}.$$

Then, $$\log\left(\frac{P(y \mid x=1)}{P(y \mid x=0)}\right) = -4\text{Re}\{h^*y\}\frac{\sqrt{E_s}}{N_o},$$

where h is the instantaneous channel gain, Re{h*y} is the function of taking the real value of a complex variable.

When N cooperating UEs are available and access links with the same average signal-to-noise ratio (SNR), the post-combining LLR that severs as the soft input of the turbo decoder for a BPSK or QPSK modulation is:

$$LLR_{combined} = \sum_{i}^{N+1} 4\text{Re}\{h_i^* y_i\}\frac{\sqrt{E_s}}{N_o},$$

where i is the index of cooperating UEs. For BPSK and QPSK modulation, LLR combining is equivalent to MRC combining for single receive antennas. Therefore, LLR combining may achieve the same performance as the JR upper bound. However, for higher level modulation, such as 16QAM, the results are not equivalent to MRC, and LLR combining performs slightly worse than the JR upper bound. However, LLR combining is more practical than JR, because it does not forward channel information separately.

Because the D2D resources are limited, the number of bits required to reliably forward the LLRs to the target UE may be reduced by quantization and compression. LLRs may be quantized in a variety of ways. In one example, the correlation between the received signals across different UEs is considered, and compression and decoding is jointly performed. In another example, each UE quantizes the LLRs separately, and a fixed number of bits are used to quantize each LLR value. Therefore, the number of quantized bits used to forward reliability over the D2D links is proportional to the amount of LLRs that are forwarded from the cooperating UEs to the target UE.

The quantization and compression process is a mapping function Q(.), which maps the analog LLR values to a sequence of binary information bits, as:

$$\vec{x} = (\vec{X}_1, \vec{X}_1, \ldots, \vec{X}_1) = Q(LLR_{CUE_1}, LLR_{CUE_2}, \ldots, LLR_{CUE_N}),$$

where q represents the total number of bits used to represent all the LLR information of the cooperating UEs after quantization and compression. Thus, the design objective of the quantizer may be:

$$\min_Q U(LLR_{CUE_1}, LLR_{CUE_2}, \ldots, LLR_{CUE_N}, LLR_{TUE}, \vec{x}),$$

subject to:

$$q \leq c.$$

U(.) is the utility function or the cost to minimize and c is the maximum number of bits that can be reliably forwarded to the target UE due to the limitation of D2D resources. The cost function is a function of the analog value of the cooperating UE LLRs and the quantization output. Also, the cost function may depend on the LLR values of the target UE. If the target UE already has a good channel quality, the quantized LLRs from the cooperating UEs proved less benefit. In one example, the cost function is a block error rate (BLER).

In practice, it is problematic to find a simple expression of the cost function. If the cost function is given, the optimal quantization and compression algorithm may be problematic to implement. A scalable quantizer with a fixed number of bits to represent the LLR values may be used.

An example quantizer is based on Lloyd-Max quantization design. For a fixed level of quantization, a set of threshold values and representative values are found to minimize the average mean squared error. The quantization is based on:

$$\tilde{x}_1 = Q(LLR_i) = t_j,$$

if $$a_{j-1} < LLR_i \leq a_j (j=1,2,\ldots m),$$

where m is the number of quantization levels. For a k-bit per LLR quantizer, $$m = 2^k,$$

and the boundary of the quantizer is given by:

$$a_j (j=0,1,\ldots,m),$$

where $$a_0 = -\infty, \text{ and}$$

$$a_m = +\infty.$$

The representative values of the quantizer output are:

$$t_j (j=1,2,\ldots,m).$$

The objective of a Lloyd-Max scalar quantizer design is to find the optimal boundaries and representative values to minimize the mean squared error. That is, $$\min_{a,t} E(LLR, \vec{x}) = \int_{-\infty}^{+\infty} f_{LLR}(x)(x-\tilde{x})^2 dx = \sum_{i=1}^{n}(LLR_i - \tilde{x}_i)^2.$$

The optimal solution should satisfy:

$$a_j = \frac{1}{2}(t_j + t_{j+1}) j = 1, 2, \ldots, m = 1, \text{ and}$$

$$t_j = E(LLR | a_{j-1} \leq LLR \leq a_j) = \int_{a_{j-1}}^{a_j} x f_{LLR}(x) dx.$$

Thus, the boundaries and representative values may be iteratively obtained.

Figure 4:
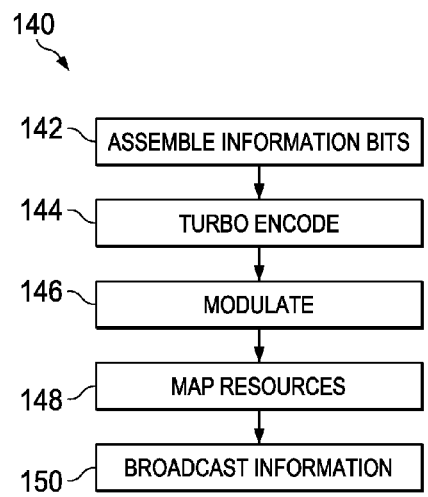
FIG. 4 illustrates a flowchart for an embodiment method of UE cooperation performed by a communications controller.
Figure 5:
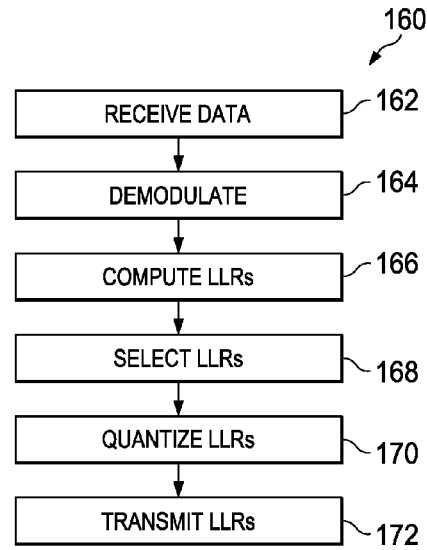
FIG. 5 illustrates a flowchart for an embodiment method of UE cooperation performed by a cooperating UE.
Figure 6:
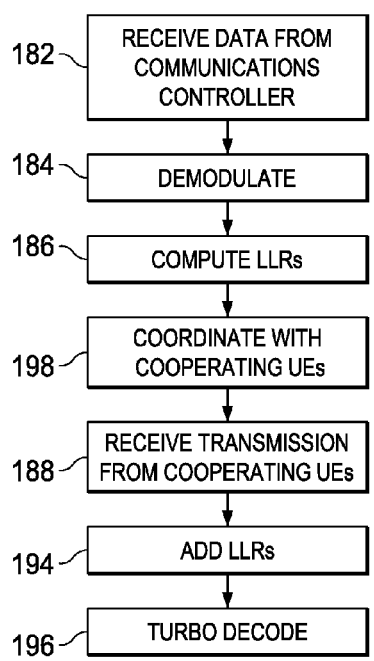
FIG. 6 illustrates a flowchart for an embodiment method UE cooperation by a target UE.

An embodiment method of UE cooperation using LLR combining is illustrated by flowchart 140 in FIG. 4 performed by a communications controller, flowchart 160 in FIG. 5 performed by a cooperating UE, and flowchart 180 in FIG. 6 performed by a target UE. Initially, in flowchart 140, the communications controller assembles information bits for transmission to the target UE in step 142.

Next, in step 144, the communications controller performs turbo encoding on the assembled information bits. This is to achieve reliable information transfer in the presence of data-corrupting noise using forward error correction (FEC) codes.

Then, in step 146, the communication controller modulates the turbo-encoded information. A variety of modulation techniques may be used, including phase-shift keying (PSK), frequency-shift keying (FSK), amplitude-shift keying (ASK), and quadrature amplitude modulation (QAM). For example, BPSK or QPSK may be used.

In step 148, the communications controller maps RBs for transmission in frequency and time. In one example, the RBs are distributed as in PRB distribution 130 for maximum frequency diversity. In another example, RBs are continuously assigned.

The communications controller broadcasts the information in step 150. The information is destined for the target UE, and also broadcast to the cooperating UEs.

FIG. 5 illustrates flowchart 160 for a method of LLR combining by a cooperating UE. This method may be performed by multiple cooperating UEs at a time. Initially, in step 162, the cooperating UE receives data from the communications controller. The received data is destined for the target UE, not the cooperating UE.

Then, in step 164, the cooperating UE demodulates the received data. The demodulation may use PSK, FSK, ASK, or QAM for demodulation. For example, demodulation may be performed using BPSK or QPSK.

Next, in step 166, the LLRs of the demodulated data are calculated. An LLR, the ratio of the probability of a bit being a one to the probability of the bit being a zero, indicates the reliability of that bit. For example, the LLR for BPSK modulated signals may be calculated as:

$$\log\left(\frac{P(y|x=1)}{P(y|x=0)}\right) = -4\text{Re}\{h^*y\}\frac{\sqrt{E_s}}{N_o}.$$

In step 168, LLRs for transmission to the target UE are selected by the cooperating UE. In one example, the LLRs for transmission are selected across different RBs of the same cooperating UE by the cooperating UE. In another example, the LLRs for transmission are selected by a central controller for multiple cooperating UEs. Alternatively, the LLRs may be selected through a hybrid approach by comparing the SNRs for both different RBs and different cooperating UEs.

The selected LLRs are quantized by the cooperating UE in step 170. For example, a fixed number of bits per LLR may be used for quantization.

In step 172, the quantized LLRs are transmitted by the cooperating UE to the target UE.

FIG. 6 illustrates flowchart 180 for a method of performing UE cooperation by a target UE. In step 182, the target UE receives data from the communications controller.

Then, in step 184, the target UE demodulates the transmission from the communications controller. The demodulation may use PSK, FSK, ASK, or QAM for demodulation. For example, BPSK or QPSK may be used.

Next, in step 186, the target UE computes the LLRs for the demodulated signals. The LLRs are:

$$\log\left(\frac{P(y|x=1)}{P(y|x=0)}\right).$$

In step 198, the target UE optionally coordinates with cooperating UEs. The target UE may broadcast a SNR threshold and/or an index of RBs indicating an SNR that is below the threshold. Also, the target UE may receive an indication of which RBs will be broadcast by the cooperating UE.

The target UE receives LLRs from one or more cooperating UEs in step 188.

In step 194, the LLRs computed from the transmission from the communications controller are added to the LLRs received from the cooperating UEs.

Finally, in step 196, turbo decoding is performed on the LLRs. The turbo decoding uses FEC codes.

In LLR combining, the LLRs to be forwarded may be selected based on frequency selective scheduling (FSS), so only a portion of the LLRs are forwarded. RBs may be the minimum unit for LLR selection. Thus, cooperating UEs only forward LLRs of certain RBs to the target UE. The LLRs for forwarding may be selected based on comparing the SNRs of different RBs for different cooperating UEs in different dimensions. The RBs may be compared horizontally across different RBs for the same cooperating UE, vertically for the same RB across different UEs, or by comparing the SNRs for both different RBs and different UEs.

Figure 7:
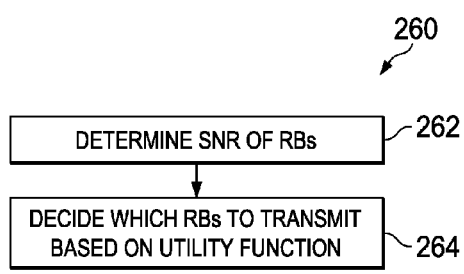
FIG. 7 illustrates a flowchart for an embodiment method of selecting LLRs to forward by a cooperating UE.

FIG. 7 illustrates flowchart 260 for a method of forwarding LLRs by a cooperating UE. Initially, in step 262, the SNRs of the RBs are determined. The average SNR for each RB may be computed using the effective exponential SNR mapping (EESM) average of sampled SNRs at different tones of the RBs.

Then, in step 264, the cooperating UE determines the LLRs of which RBs to transmit based on a utility or cost function. This may be performed with the assistance of a centralized controller. The utility function may be defined as a cost function of the SNRs for the cooperating UEs and the target UE for the assigned RBs. D2D link qualities may serve as additional parameters when they are known by the centralized controller. The resource usage on the D2D links may be constrained as the total amount of LLRs forwarded. The decision of whether a particular cooperating UE forwards the LLRs of a particular RB involves minimizing the utility function subject to the resource constraint. Thus:

$$\min_{D_{i,j}(i=1,2,\ldots,N;\,j=1,2,\ldots,M)} f(\gamma_{i,j}(i=1,2,\ldots,N;\,j=1,2,\ldots,M),\gamma'_j(j=1,2,\ldots,M)),$$

subject to:

$$\sum_{i=1}^{N}\sum_{j=1}^{M} D_{i,j} \leq T,$$

where N is the total number of CUEs, M is the total number of assigned RBs, i and j are the indexes of CUEs and RBs, respectively; $\gamma$ and $\gamma'$ are the SNRs of CUE and TUE, respectively. And $D_{i,j} \in \{0,1\}$ is the decision variable which represents whether LLRs corresponds to j-th RB of i-th CUE are selected to transmit.

In an embodiment method of LLR combining, the cooperating UEs select LLRs for forwarding. This method has a low signaling overhead, with the D2D bandwidth reduced by forwarding a small number of LLRs from the cooperating UEs to the target UE. This method does not require a centralized controller. The cooperating UEs make decisions based on their own SNRs with minimal signaling overhead.

Figure 8:
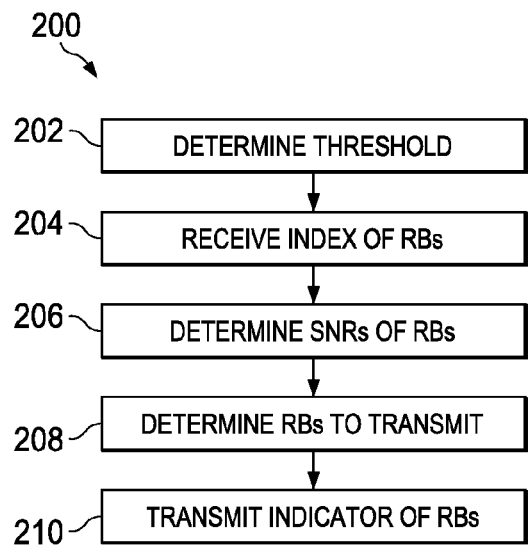
FIG. 8 illustrates a flowchart for an embodiment method of selecting LLRs for forwarding to a target UE in LLR combining.

FIG. 8 illustrates flowchart 200 for a method of selecting LLRs for transmission by a cooperating UE in LLR combining. This method may be performed by multiple cooperating UEs at a time. Initially, in step 202, the cooperating UE determines a threshold. In one example, threshold is a predefined threshold. In another example, the threshold is determined based on a transmission from the target UE. In an additional example, the threshold is determined by the central controller. The threshold may be between 0 dB and 10 dB, for example 5 dB.

Optionally, in step 204, the cooperating UE receives a transmission from the target UE indicating which RBs the target UE needs help with. For example, the cooperating UE receives an index of the RBs of the target UE that are below the threshold from the target UE. In an example, the index of RBs is represented by one bit for each RB.

Next, in step 206, the cooperating UE determines the SNRs of the RBs it has received from the communications controller. The SNR compares the ratio of the RB signal to the level of the background noise.

Then, in step 208, the cooperating UE determines for which RBs to broadcast the corresponding LLRs. The cooperating UE may decide to transmit the LLRs of RBs when the index of RBs indicates that the target UE needs help and the SNRs of the RBs are above the threshold. When the SNR of an RB at the target UE is high, the cooperating UE does not need to transmit the corresponding LLR, because the target UE already has a good signal. When the SNR of the RB at the cooperating UE is low, transmitting the corresponding LLRs would not be very helpful. However, when the SNR of the RB at the target UE is low and the SNR of the RB at the cooperating UE is high, transmitting the corresponding LLRs adds significant value.

In another example, in step 208, the best M out of N total RBs in terms of SNR at the cooperating UE are transmit to the target UE. This reduces the D2D resource usage to M/N of the usage when forwarding all the LLRs. In an additional example, M/N RBs are transmitted only when the SNR of RB at the target UE is less than a threshold.

Finally, in step 210, the cooperating UE transmits a message to the target UE indicating which RBs for which the cooperating UE will transmit the corresponding LLRs.

Figure 9:
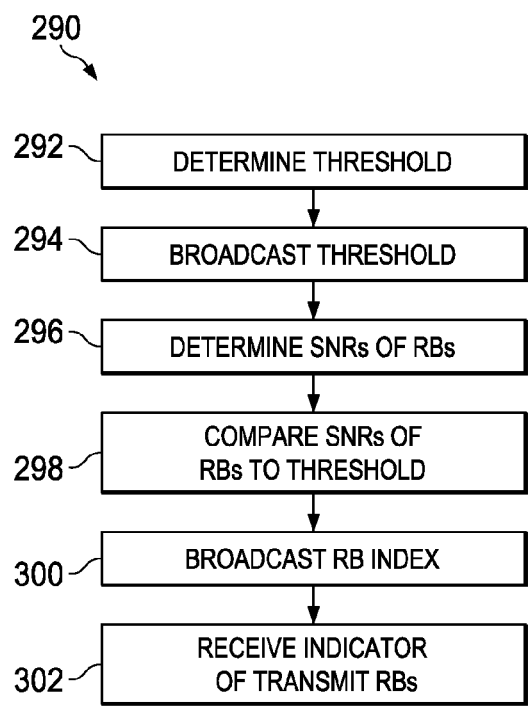
FIG. 9 illustrates a flowchart for another embodiment method of selecting LLRs for forwarding to a target UE in LLR combining.

FIG. 9 illustrates flowchart 290 for a method of selecting LLRs for transmission by cooperating UEs to a target UE, performed by the target UE. Initially, in step 292, the target UE determines a threshold. In one example, the threshold is predetermined. In another example, the target UE selects the threshold. The target UE may dynamically determine the threshold based on the modulation and coding scheme (MCS), the SNR of its own access link, and the available D2D resources. In an additional example, the threshold is determined by the central controller and transmitted from central controller to the target UE.

After the target UE selects the threshold, it broadcasts the selected threshold to the cooperating UEs in step 294. When the threshold is predetermined, the target UE skips steps 292 and 294, and proceeds directly to step 296.

In step 296, the target UE determines the SNRs of the RBs. The SNR indicates the ratio of the RB signal power to the background noise. The average SNR for each RB may be computed using the EESM average of sampled SNRs at different tones of the RB.

Then, in step 298, the target UE compares the SNRs of the RBs to the threshold. The target UE determines an RB index that indicates which RBs have SNRs below the threshold. For example, the RB index may have one bit per RB.

Next, in step 300, the target UE broadcasts the RB index to the cooperating UEs.

In response, the target UE receives messages from the cooperating UEs indicating which RBs which cooperating UEs will transmit the corresponding LLRs for in step 302.

In another example method for selecting LLRs for forwarding for LLR combining, a centralized controller determines which cooperating UEs will transmit LLRs corresponding to which RBs. This method reduces the D2D bandwidth used by 1/N, compared to N cooperating UEs that each forward all the LLRs to the target UE. However, this method utilizes additional signaling bandwidth for communications with a centralized controller. This method is similar to FSS scheduling used in cellular systems. However, fairness is not considered.

Figure 10:
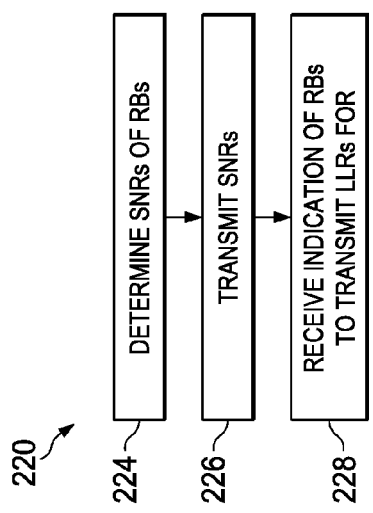
FIG. 10 illustrates a flowchart for an additional embodiment method of selecting LLRs for forwarding to a target UE in LLR combining.

FIG. 10 illustrates flowchart 220 for a method of determining LLRs for transmission in LLR combining by a cooperating UE. This method may be performed by multiple cooperating UEs. Initially, in step 224, the cooperating UE determines the SNRs of the RBs by determining the ratios of the signal powers to the noise powers. The average SNR per RB may be computed using the EESM average of sampled SNRs at different tones of the RBs.

Then, in step 226, the cooperating UE transmits the SNRs of its RBs to the centralized controller.

Next, in step 228, the cooperating UE receives a message from the centralized controller. The message indicates which RBs that cooperating UE should transmit the corresponding LLRs.

Figure 11:
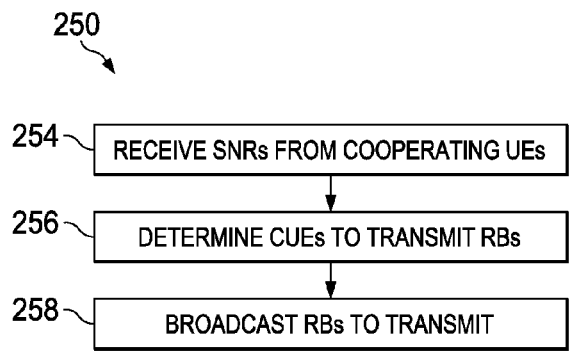
FIG. 11 illustrates a flowchart for another embodiment method of selecting LLRs to forward to a target UE in LLR combining.

FIG. 11 illustrates flowchart 250 for a method of determining which cooperating UEs will transmit LLRs corresponding to which RBs performed by a centralized controller. The centralized controller may be a stand-alone device, a UE, or another device. Initially, in step 254, the centralized controller receives the SNRs for the RBs from the cooperating UEs.

Then, in step 256, the centralized controller determines which cooperating UEs will transmit LLRs corresponding to which RBs. In one example, the centralized controller determines that the cooperating UE with the best SNR for a given RB will transmit the LLR corresponding to that RB. Thus, only the cooperating UE with the best access link at each RB transmits the corresponding LLR. In another example, the LLR corresponding to the RB with the best SNR is only transmitted when the SNR that RB at the target UE is below a threshold. This further reduces the D2D link resource usage.

In an additional example, in step 256, only the worst M of N RBs of the target UE are forwarded from the cooperating UE to the target UE. This example further reduces the D2D link usage.

Finally, in step 258, the centralized controller sends message indicating which LLRs are to be transmitted for all the cooperating UEs. These messages are transmitted to the cooperating UEs and the target UE.

Figure 12:
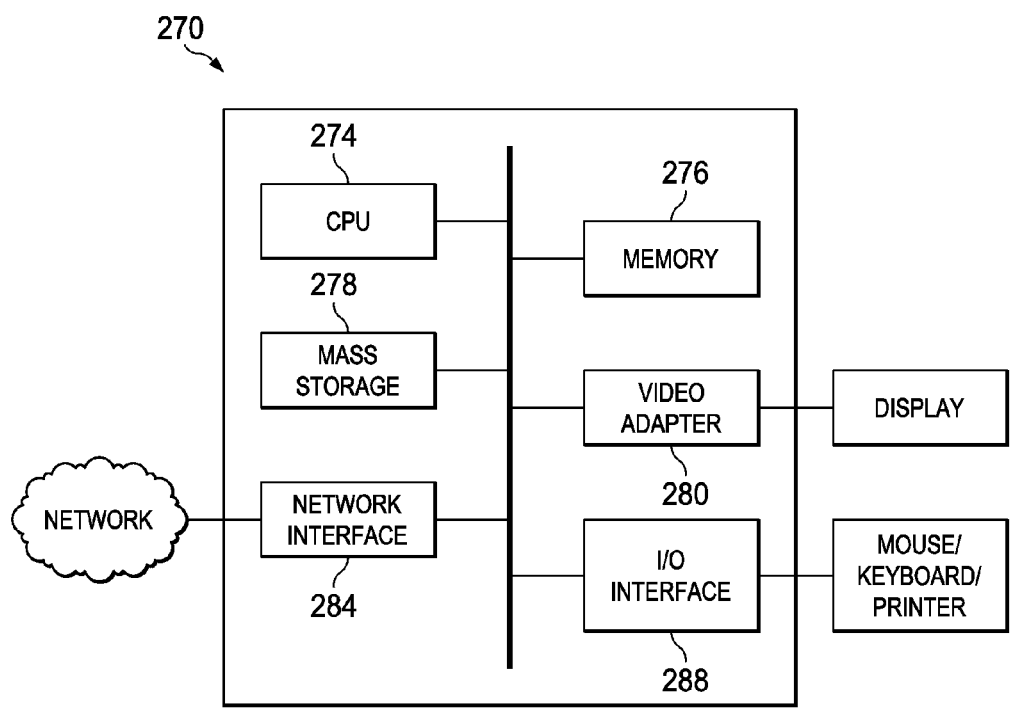
FIG. 12 illustrates a block diagram of an embodiment general-purpose computer system.

FIG. 12 illustrates a block diagram of processing system 270 that may be used for implementing the devices and methods disclosed herein. Specific devices may utilize all of the components shown, or only a subset of the components, and levels of integration may vary from device to device. Furthermore, a device may contain multiple instances of a component, such as multiple processing units, processors, memories, transmitters, receivers, etc. The processing system may comprise a processing unit equipped with one or more input devices, such as a microphone, mouse, touchscreen, keypad, keyboard, and the like. Also, processing system 270 may be equipped with one or more output devices, such as a speaker, a printer, a display, and the like. The processing unit may include central processing unit (CPU) 274, memory 276, mass storage device 278, video adapter 280, and I/O interface 288 connected to a bus.

The bus may be one or more of any type of several bus architectures including a memory bus or memory controller, a peripheral bus, video bus, or the like. CPU 274 may comprise any type of electronic data processor. Memory 276 may comprise any type of system memory such as static random access memory (SRAM), dynamic random access memory (DRAM), synchronous DRAM (SDRAM), read-only memory (ROM), a combination thereof, or the like. In an embodiment, the memory may include ROM for use at boot-up, and DRAM for program and data storage for use while executing programs.

Mass storage device 278 may comprise any type of storage device configured to store data, programs, and other information and to make the data, programs, and other information accessible via the bus. Mass storage device 278 may comprise, for example, one or more of a solid state drive, hard disk drive, a magnetic disk drive, an optical disk drive, or the like.

Video adaptor 280 and I/O interface 288 provide interfaces to couple external input and output devices to the processing unit. As illustrated, examples of input and output devices include the display coupled to the video adapter and the mouse/keyboard/printer coupled to the I/O interface. Other devices may be coupled to the processing unit, and additional or fewer interface cards may be utilized. For example, a serial interface card (not pictured) may be used to provide a serial interface for a printer.

The processing unit also includes one or more network interface 284, which may comprise wired links, such as an Ethernet cable or the like, and/or wireless links to access nodes or different networks. Network interface 284 allows the processing unit to communicate with remote units via the networks. For example, the network interface may provide wireless communication via one or more transmitters/transmit antennas and one or more receivers/receive antennas. In an embodiment, the processing unit is coupled to a local-area network or a wide-area network for data processing and communications with remote devices, such as other processing units, the Internet, remote storage facilities, or the like.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A method comprising:
    detecting, by a cooperating user equipment (UE), a message transmitted from a communications controller to a target UE, the target UE being an intended recipient of the message, using a plurality of resource blocks (RBs), wherein each of the plurality of RBs includes a different set of time-frequency resources;
    determining a plurality of reliability indications in accordance with the plurality of RBs, the plurality of reliability indications corresponding to the plurality of RBs; and
    transmitting, wirelessly by the cooperating UE to the target UE, a subset of the determined plurality of reliability indications, the cooperating UE being different than the target UE and the subset of the plurality of reliability indications corresponding to a subset of the plurality of RBs.

2. The method of claim 1, further comprising selecting a portion of reliability indications of the plurality of reliability indications, wherein transmitting the subset of the determined plurality of reliability indications comprises transmitting the selected portion of reliability indications.

3. The method of claim 1, wherein the step of determining includes identifying at least one RB carrying the message with the target UE as the intended recipient, and determining a reliability indication for each of the at least one identified RB; and wherein the step of transmitting includes transmitting each determined reliability indication for each of the at least one identified RB to the target UE.

4. The method of claim 1, further comprising demodulating data of the message to produce demodulated data, wherein determining the plurality of reliability indications further comprises determining the plurality of reliability indications in accordance with the demodulated data.

5. The method of claim 4, wherein demodulating the data is phase-shift keying (PSK) demodulating the data, frequency-shift keying (FSK) demodulating the data, amplitude-shift keying (ASK) demodulating the data, or quadrature amplitude modulation (QAM) demodulating the data.

6. The method of claim 1, further comprising determining a plurality of signal-to-noise ratios (SNRs) for the plurality of RBs, and selecting the subset of the determined plurality of reliability indications in accordance with the plurality of SNRs.

7. The method of claim 6, wherein determining the plurality of SNRs further comprises determining the plurality of SNRs using an effective exponential SNR mapping (EESM) average of sampled SNRs at different tones of the plurality of RBs.

8. The method of claim 6, wherein selecting the subset of the determined plurality of reliability indications further comprises determining a subset of RBs of the plurality of RBs, wherein RBs of the subset of RBs have SNRs greater than a threshold, and wherein selecting the subset of the determined plurality of reliability indications further comprises selecting the subset of the determined plurality of reliability indications corresponding to the subset of RBs.

9. The method of claim 8, further comprising receiving, by the cooperating UE, the threshold.

10. The method of claim 6, further comprising:
    transmitting, by the cooperating UE to a central controller, the plurality of SNRs; and
    receiving, by the cooperating UE from the central controller, an indication message, wherein the indication message identifies the subset of the determined plurality of reliability indications.

11. The method of claim 1, wherein signal-to-noise ratios (SNRs) for the subset of the plurality of RBs at the target UE are lower than SNRs for the subset of the plurality of RBs at the cooperating UE.

12. A method comprising:
    receiving, by a central controller from a first cooperating UE, a plurality of first signal-to-noise ratio (SNR) measurements corresponding to a plurality of resource blocks (RBs), wherein a plurality of reliability indications correspond to the plurality of RBs, and each RB includes an individual set of time-frequency resources; and
    transmitting, by the central controller, to the first cooperating UE a message indicating a subset of RBs from the plurality of RBs, wherein the subset of RBs correspond to a subset, of the plurality of reliability indications to be transmitted wirelessly by the first cooperating UE, the subset of the plurality of reliability indications corresponding to a subset of the plurality of RBs.

13. The method of claim 12, further comprising transmitting, by the central controller to a target UE, a message indicating the subset of RBs from the plurality of RBs, wherein the subset of RBS correspond to the subset of the plurality of reliability indications to be transmitted by the first cooperating UE.

14. The method of claim 12, wherein the central controller is a UE.

15. The method of claim 12, wherein the central controller is a stand-alone device.

16. The method of claim 12, further comprising:
    receiving, by the central controller from a second cooperating UE, a plurality of second SNR measurements corresponding to the plurality of RBs; and
    selecting the subset of RBs from the plurality of RBs in accordance with the plurality of first SNR measurements and the plurality of second SNR measurements.

17. A central controller comprising:
    a processor; and
    a non-transitory computer readable storage medium storing programming for execution by the processor, the programming including instructions to:
        receive, from a first cooperating UE, a plurality of first signal-to-noise ratio (SNR) measurements corresponding to a plurality of resource blocks (RBs), wherein a plurality of reliability indications correspond to the plurality of RBs, and each RB includes an individual set of time-frequency resources, and
        transmit to the first cooperating UE a message indicating a subset of RBs from the plurality of RBs, wherein the subset of RBs correspond to a subset, of the plurality of reliability indications, to be transmitted wirelessly by the first cooperating UE, the subset of the plurality of reliability indications corresponding to a subset of the plurality of RBs.

18. The central controller of claim 17, wherein the programming includes further instructions to:
    receive from a second cooperating UE, a plurality of second SNR measurements corresponding to the plurality of RBs; and select the subset of RBs from the plurality of RBs in accordance with the plurality of first SNR measurements and the plurality of second SNR measurements.

\* \* \* \* \*